United States Patent [19]
Ochoa et al.

[11] Patent Number: 5,812,470
[45] Date of Patent: Sep. 22, 1998

[54] APPARATUS, SYSTEM AND METHOD FOR IDENTIFYING SEMICONDUCTOR MEMORY ACCESS MODES

[75] Inventors: Roland Ochoa; Kacey Cutler; Craig Schneider; Gary Gilliam; Steven Renfro, all of Boise, Id.

[73] Assignee: Micron Technology, Inc., Boise, Id.

[21] Appl. No.: 709,858

[22] Filed: Sep. 10, 1996

[51] Int. Cl.⁶ .................................... G11C 7/00
[52] U.S. Cl. ............... 365/201; 365/225.7; 365/230.08; 365/238.5
[58] Field of Search ............... 365/201, 230.03, 365/225.7, 238.5, 230.08

[56] References Cited

U.S. PATENT DOCUMENTS

| | | | |
|---|---|---|---|
| 4,507,761 | 3/1985 | Graham | 365/230 |
| 4,609,985 | 9/1986 | Dozier | 365/200 |
| 4,958,345 | 9/1990 | Fujisaki | 371/21.3 |
| 5,479,635 | 12/1995 | Kametani | 395/405 |
| 5,483,498 | 1/1996 | Hotta | 365/233.5 |
| 5,526,320 | 6/1996 | Zagar et al. | 365/233.5 |
| 5,596,537 | 1/1997 | Sukegawa et al. | 365/201 |
| 5,617,362 | 4/1997 | Mori et al. | 365/189.05 |
| 5,627,838 | 5/1997 | Lin et al. | 371/21.1 |

*Primary Examiner*—David C. Nelms
*Assistant Examiner*—Hien Nguyen
*Attorney, Agent, or Firm*—Dickstein Shapiro Morin & Oshinsky LLP

[57] ABSTRACT

An apparatus, system and method for identifying an access mode of a semiconductor memory in a data processing system, characterized by significant reduction of the possibility of erroneous identification of the access mode. A semiconductor memory has an access circuit bank with plurality of selectable circuits only one of which is activated, each selectable circuit respectively associated with a selectable semiconductor memory access mode, the access mode selection typically being accomplished by selectively blowing fuses associated with the corresponding selectable circuits. A semiconductor memory access mode is correctly identified by associating, in response to a test signal for determining the fuse status, the respective activated selectable circuit with its corresponding access mode.

29 Claims, 5 Drawing Sheets

FIG. 1

| STATUS \ SITE | TM | I/O | FUSE | DQ PAD |
|---|---|---|---|---|
| NO TEST | 0 | 0 | NOT BLOWN | 0 |
| TEST | 1 | 0 | NOT BLOWN | 0 |
| NO TEST | 0 | 1 | BLOWN | 1 |
| TEST | 1 | 1 | BLOWN | 1 |

SIGNAL TRUTH TABLE

| $T_M$ | I/O | FUSE (0=UNBLOWN) | DQ PAD |
|---|---|---|---|
| 0 | 0 | Don't Care | 0 |
| 0 | 1 | Don't Care | 1 |
| 1 | Don't Care | 0 | 0 |
| 1 | Don't Care | 1 | 1 |

ALTERNATE TRUTH TABLE
FOR A THREE-INPUT SYSTEM

FIG. 7

APPARATUS, SYSTEM AND METHOD FOR IDENTIFYING SEMICONDUCTOR MEMORY ACCESS MODES

I. BACKGROUND OF THE INVENTION

1. Field of the Invention

The present invention relates generally to random access memories and, more particularly, to DRAM semiconductive memories, access modes for such memories, and methods for identifying such memories and their access modes.

2. Description of the Related Art

Semiconductor memories known as DRAMs can function in a number of operational modes. These modes include fast page mode (FPM), extended data out (EDO) mode, and burst extended data out (BEDO). Typically, the DRAM includes separate circuit blocks corresponding to each of these operational modes. All of the above-mentioned fast readout modes provide the advantage of reducing the number of clock cycles needed to read out certain data. The DRAM is permanently placed in one of these operation modes by selectively blowing fuses, which thus may be termed "option fuses", on the chip so that only one of these circuit blocks is powered up to supply appropriate control signals to address and I/O buffers of the DRAM. A collection of such circuits, only one of which is activated, may be called an access circuit bank.

Typically, in such prior art memories and systems applying them, there is a separate bank of circuits, which can be called the fuse ID bank. A particular pattern of blown fuses in the separate fuse ID bank identifies the semiconductor memory by indicating the access mode in which it has been permanently placed, as well as facts of its history, such as lot, wafer, and die information. In order to detect the access information bit in an arrangement that is economical in use of circuitry, the access information bit for each access circuit is typically applied to a pair of multiplexer circuits at one input of each, while to a second input of each is applied the test signal that, if present, is testing whether the particular access mode is activated. The I/O data signal is applied to a third input of one of the balanced circuits, when present, and the inverse of the I/O data signal, when present, is applied to a third input of the other. Such a circuit arrangement yields a unique output signal corresponding to activation of an access circuit, when the test signal is present and the particular associated access circuit, representing the selected mode, is in fact activated.

Even if only a few different access modes were originally possible, the fuse ID bank typically includes a large number of fuses, e.g., 32 fuses, and corresponding circuits for detecting the state of each.

Unfortunately, experience with the above described DRAMs has shown that a fuse can be blown in the fuse ID bank indicating a wrong access mode, that is, indicating an access mode other than the one established by a blown fuse in the access circuit bank. Accordingly, the fuse ID bank may designate one access mode as activated, when, in fact, the DRAM has been permanently placed, i.e., programmed to operate, in another access mode. Moreover, in order to guard against such an error and cross-check the operational mode of the DRAM, an entire row of data must frequently be read out of the array. Accordingly, the amount of time required for testing can be excessive. Both the extra testing and the mis-identification of memories reduce manufacturing yield and increase costs.

II. SUMMARY OF THE INVENTION

The present invention solves the above problems by including a single fuse that not only acts as part of a fuse ID bank but also selectively powers up the selected access mode circuitry of the DRAM.

Thus, the invention eliminates the possibility for inconsistency between the selected access mode and the fuse ID bank data for the semiconductor memory.

An additional advantage of the present invention resides in increased production yields and reduced production costs. Related advantages extend to the data processing system in which the memory is used, and to its method of operation.

According to one aspect of the invention, a semiconductor memory employs a plurality of memory cells in an array having two coordinates with associated rows and columns. Access circuitry connecting to any of the plurality of memory cells having a designated value of at least one coordinate includes a plurality of selectable circuits respectively associated with a plurality of different access modes. One of the selectable circuits may be selected to connect to any of the plurality of memory cells in an associated one of the plurality of different access modes. The memory includes circuitry having an input terminal for a test signal for identifying in response to the test signal the selected one of the selectable circuits or the associated one of the plurality of different modes. The circuitry for identifying includes a plurality of connections, each to a respective one of the plurality of selectable circuits, and circuitry indicating the selected one of the selectable circuits.

According to another aspect of the invention, a data processing system includes input and output terminals and a processor connected between the input and output terminals, the processor having at least one central processing unit and a semiconductor memory. The semiconductor memory employs a plurality of memory cells in an array having two coordinates with associated rows and columns. Access circuitry connecting to any of the plurality of memory cells having a designated value of at least one coordinate includes a plurality of selectable circuits respectively associated with a plurality of different access modes. One of the selectable circuits may be selected to connect to any of the plurality of memory cells in an associated one of the plurality of different access modes. The memory includes circuitry having an input terminal for a test signal for identifying in response to the test signal the selected one of the selectable circuits or the associated one of the plurality of different modes. The circuitry for identifying includes a plurality of connections, each to a respective one of the plurality of selectable circuits, and an output circuit for indicating the selected one of the selectable circuits.

According to a further aspect of the invention, a method of identifying a semiconductor memory according to type of memory, includes the steps of adapting the memory for a selected type of access mode and applying a test signal to said memory. Further, the method includes multiplexing the test signal with another signal to produce a third signal indicative of the selected type of access mode and separating the third signal from the multiplexed signal as an output signal identifying the selected type of access mode in response to the test signal.

Additional features and advantages of the invention will be set forth in the description which follows and in part will be apparent from the description, or may be learned by practicing the invention. The advantages of the invention will be realized and attained by the apparatus, systems and method particularly pointed out in the following written description, drawings, and claims.

The following detailed description is both exemplary and provides further explanation of the claimed invention. The accompanying drawings also provide a further understanding of the invention and illustrate embodiment of the invention and its implementation. Together with the description, the drawings also explain the principles of the invention.

IV. DETAILED DESCRIPTION OF THE PREFERRED EMBODIMENT

Reference will be made in detail to a currently preferred embodiment of the invention, an implementation of which is illustrated in the accompanying drawings. Like reference numerals refer to like parts in the various figures of the drawings.

In the present invention, a memory includes circuitry having an input terminal for receiving a test signal, to test for the identity of a circuit, which is the selected one of the selectable circuits. The selected circuit activates a particular access mode. The memory further includes output circuitry for indicating the selected one of the selectable circuits. In the preferred embodiment, an activation signal from a bank of the access circuits, corresponding to a particular one of the access circuits, is multiplexed with I/O signals and one of the multiplexed signals is output in response to a test signal, when present, at a corresponding pair of multiplexers to identify at the buffered output thereof, the activated access circuit.

In the preferred implementation, the selected one of the selectable circuits is selected by blowing a fuse; and the selected circuit is thereby "powered up". The same fuse then becomes the source of identification for the selected circuits.

The differing access modes are here briefly described.

Fast Page Mode (FPM) starts with the activation of a row in the DRAM array by providing a row address and bringing row address strobe (RAS#) LOW. Then, multiple column access may be executed by cycling column address strobe (CAS#). Each CAS# cycle includes applying a column address, bringing CAS# LOW, waiting for valid data, and preparing for the next cycle, in that order. The column address is set up in advance. The FPM is, however, theoretically limited with respect to peak burst rate.

Extended Data-out Mode (EDO) is similar to FPM, except that CAS# going HIGH does not disable the data outputs. Instead, a data latch is used to guarantee that valid data is held until CAS# goes LOW again. The data latch is controlled by CAS#; and data is effectively captured in the latch as a result of CAS# going HIGH.

Burst Extended Data-out Mode (BEDO) differs from EDO in two ways. First, because the data latch is replaced by a register (i.e., an additional latch stage is added), data will not reach an output as a result of a first CAS# cycle. The benefit of this internal pipeline stage is that data will appear in a shorter time from the activating CAS# signal edge in the second CAS# cycle. In other words, 'CAC (maximum access time from CAS# HIGH-to-LOW transition) is shorter. The second difference is that the access circuits for this mode include an internal address counter so that only the initial address in a burst of four needs to be provided externally. Moreover, there is in fact no additional delay in receiving the first data element because the access time needed for the RAS# (Row Address Strobe) signal in effect hides the first CAS# cycle.

Figure 1:
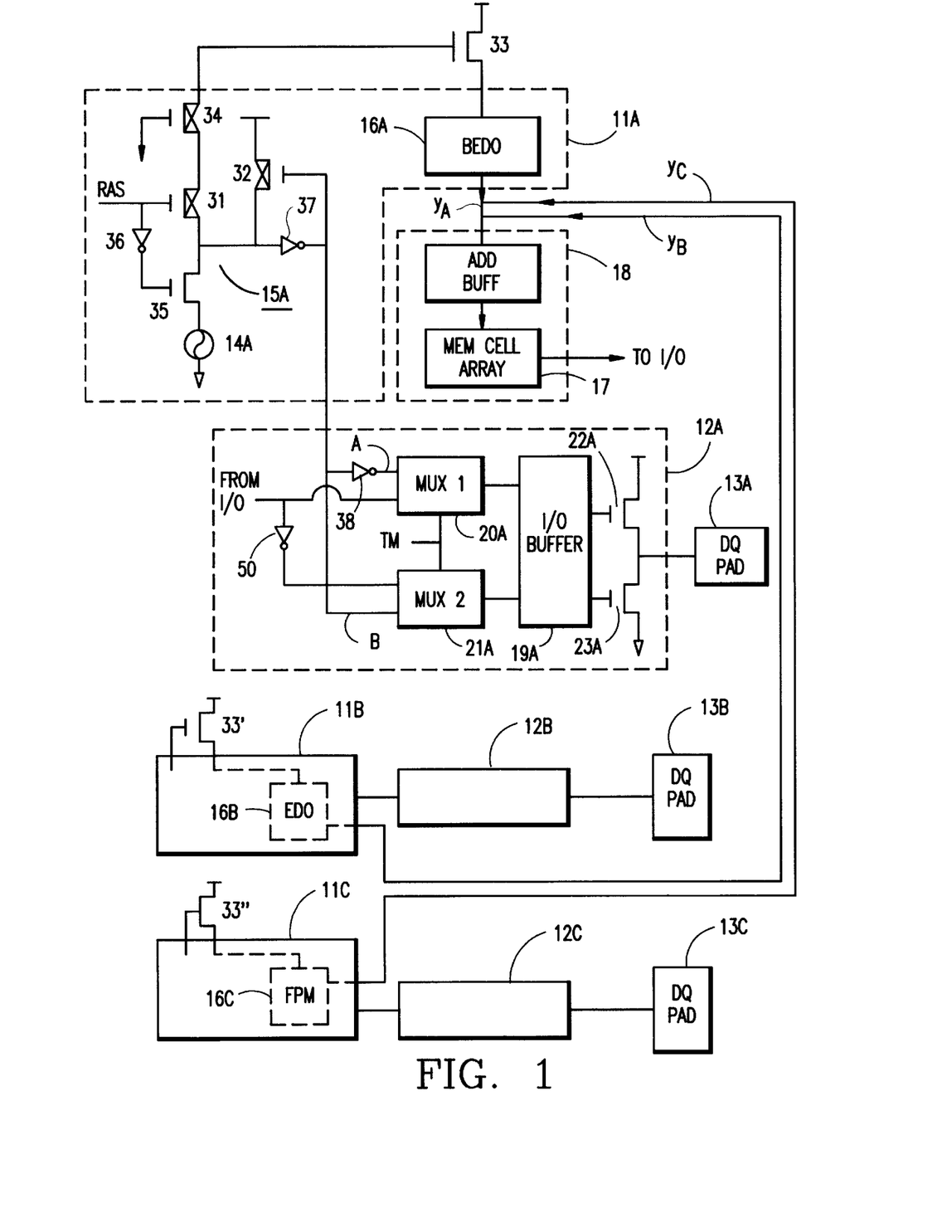
FIG. 1 is a diagram of a preferred embodiment of the invention.

In FIG. 1, the memory includes an array 17 of memory cells (not shown) of a DRAM semiconductive memory, at least three access control circuits 11A, 11B, and 11C, and a corresponding number of access test circuits 12A, 12B, and 12C. Each access test circuit is associated with a corresponding output pad 13A, 13B, and 13C. Access control circuit 11A includes a fuse 14A for placing the DRAM memory in a burst extended data-out (BEDO) mode. The fuse 14A is coupled between the gate of transistor 33 and ground via the control cell 15A, to which the row address strobe signal RAS is applied. Prior to a selection step that blows the fuse 14A, the power supply voltage is borne across transistor 32, so that the gate of the n-channel transistor 33 is held low and transistor 33 remains off. When the fuse is blown, preferably by a laser, and the signal RAS is present at the gate of transistor 33, however, the potential of the gate of the MOS transistor 33 is raised toward the supply voltage. Accordingly, the transistor 33 is turned on and the BEDO circuit block 16A is coupled to power supply voltage to supply control signal $Y_A$ to the address and I/O buffers and array 17 in array control block 18. Similar fuses 14B and 14C to selectively power up the EDO and fast page mode (FPM) circuit blocks 16B and 16C, respectively, are supplied via similar control paths (including, for example, transistors 33' and 33"). Respectively different control signals $Y_B$ and $Y_C$ would then be supplied to array control block 18 from access control circuits 11B and 11C, respectively.

Internally, each of the access test circuits 12A, 12B, and 12C is organized as shown for access test circuit 12A, in order to provide either an identified activated access mode signal, or no such signal, at its output terminal (DQ pad), e.g., 13A, as shown in FIG. 1. If the fuse is not blown, the BEDO mode is not selected. In such case of "deselection", input A of MUX1 20A is grounded, via inverters 37 and 38, while input B of MUX2 21A is set high.

Figure 3:
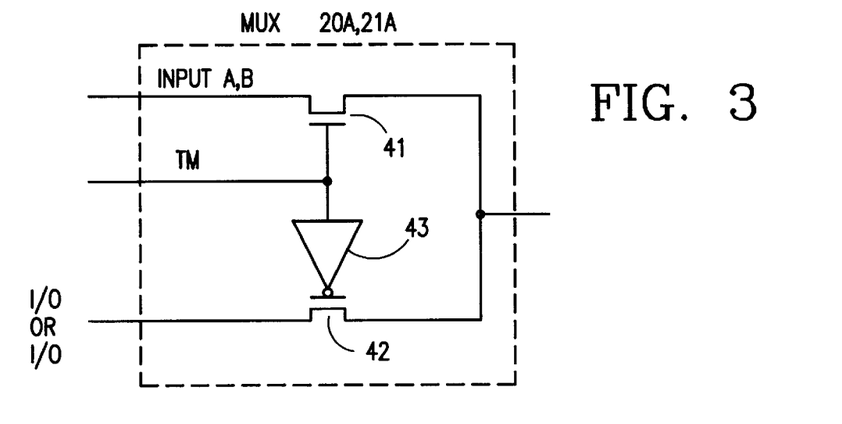
FIG. 3 shows an optional multiplexer circuit.

Further, if the data processing system in which the memory is placed can accommodate it, multiplexers 20A and 21A preferably include circuits as shown in FIG. 3, in which transistors 41 and 42 have their gates connected through an inverter 43; and the access mode test signal TM is applied at the input of the inverter. Input signals A or B, on the one hand, and the I/O data signals (I/O and its complement I/O*), on the other hand, are applied to respective inputs of transistors 41 and 42.

When test mode signal TM goes high, a low potential is output from MUX1 through buffer 19A, which cuts off pull up transistor 22A, while MUX2 outputs through buffer 19A a high signal to the gate of pull down transistor 23A. As a result, transistor 23A is turned on and the DQ pad 13A is set to a low potential. The DQ pad 13A preferably remains grounded, regardless of the potential at the I/O mode, shown in FIG. 1.

On the other hand, when the fuse 14A is blown, as shown, selection of the BEDO mode has occurred. Input A is set high and input B is set low. Accordingly, when signal TM goes high, MUX1 and MUX2 output high and low potentials, respectively, so that transistor 22A is conductive and transistor 23A is cut off. Accordingly, the DQ pad 13A is set to a high potential. When signal TM is low, MUX1 and NUX2 pass data signals I/O and I/O* (I/O* being supplied through inverter 50, which produces it from I/O, to MUX2) to the gates of transistors 22A and 23A, respectively, to output data to the DQ pad 13A. Accordingly, the operational mode of the DRAM can be determined by reading a high bit at a specific DQ pad, e.g., 13A.

One important difference from the prior art is that the signals labeled "input A" and "input B" come from an access control circuit, such as access control circuit 11A, instead of coming from a separate fuse ID bank. While no such fuse ID bank is shown in FIG. 1, it could still be employed for supplying the other characteristic data of a semiconductor memory, such as lot, wafer, and die numbers. An error in initially programming these items by an operator is less critical than an error in identifying the access mode for the memory. There is a separate test mode, of known type, for the ID fuse bank.

In more detail, in FIG. 1, when RAS goes low and fuse 14A has been blown, transistor 31 is rendered conductive, thereby supplying power supply voltage to the gate of transistor 33 and activating the BEDO circuit block 16A. Transistor 32 is held on through inverter 37 and transistor 35 is turned on through inverter 36. Input A to MUX1 is inverted by inverter 38, while input B to multiplexer MUX2 is directly connected to the output of inverter 37. When signal TM goes high, the high potential on input A is passed through MUX1, buffered, and supplied to the gate of 22A. Further, the low potential present at input B of MUX2 is passed to the gate of transistor 23A. Thus, transistor 22A is rendered conductive and transistor 23A is cut off so that the potential on the DQ pad 13A is rendered high, indicative, in this example, of BEDO operation.

Similar operations occur in circuits 11B and 12B, or 11C and 12C, if EDO or FPM are selected.

Figure 2:
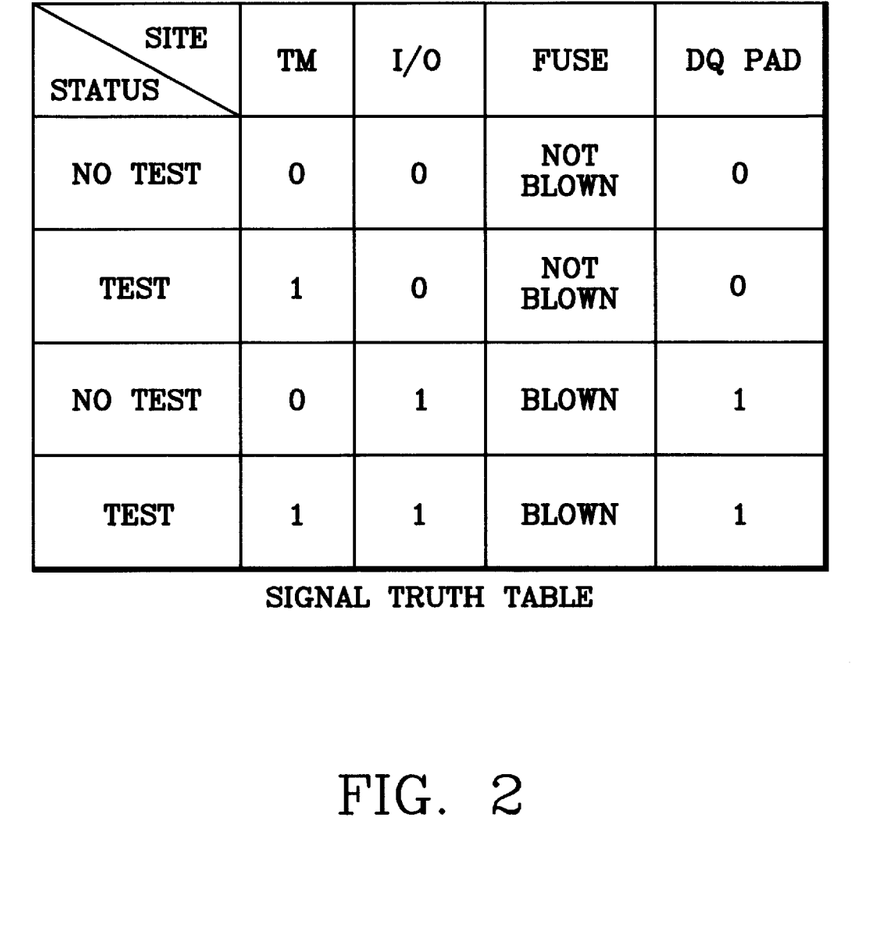
FIG. 2 shows a truth table for the multiplexers of FIG. 1, with respect to a test signal and an access circuit signal indicative of the state of its activating fuse.

FIG. 2 presents a truth table for the above-described circuit of FIG. 1. The first two rows indicate that, for the fuse not blown, the signal at the output DQ pad 13A is low, while for the fuse blown, the output signal is high. The associated data processing system is only looking for the signal at the DQ pads when the test signal TM is present. Thus, the resulting identification signal is unique and is free from inconsistency from any other source.

Figure 7:
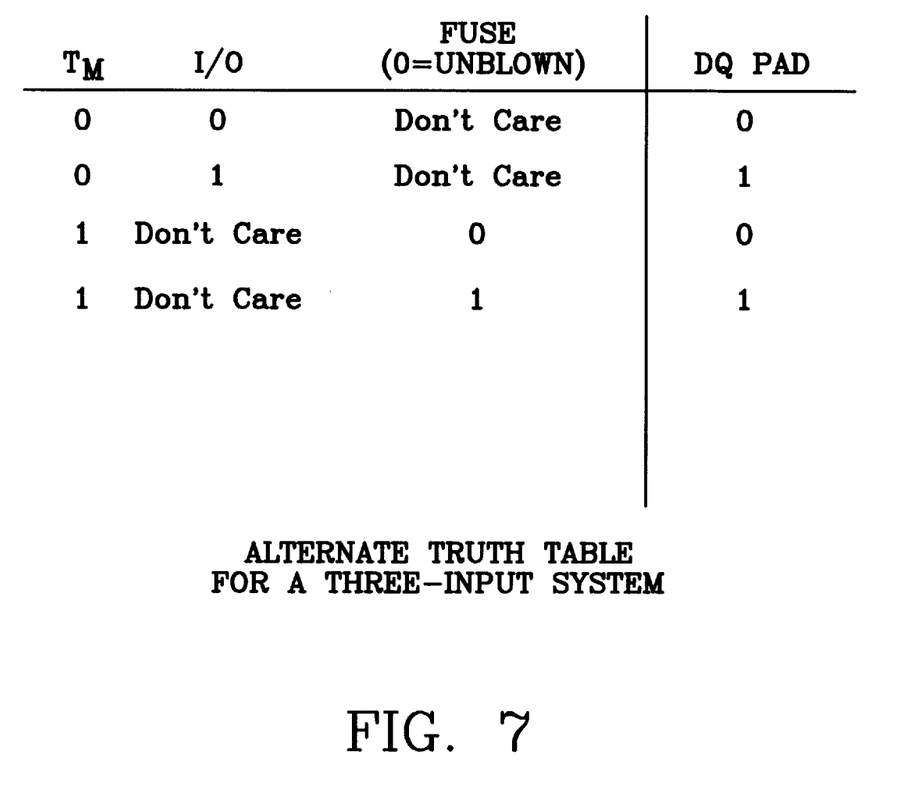
FIG. 7 shows an alternate truth table for the embodiment of FIG. 1.

FIG. 7 shows an alternate truth table covering all eight possible conditions for a three-input system.

In the other aspect of the present invention, summarized in the Summary of the Invention, above, such signal coordination with the data processing system in which the memory of FIG. 1 is placed improves the throughput and yield of the manufacture of such systems.

Figure 4:
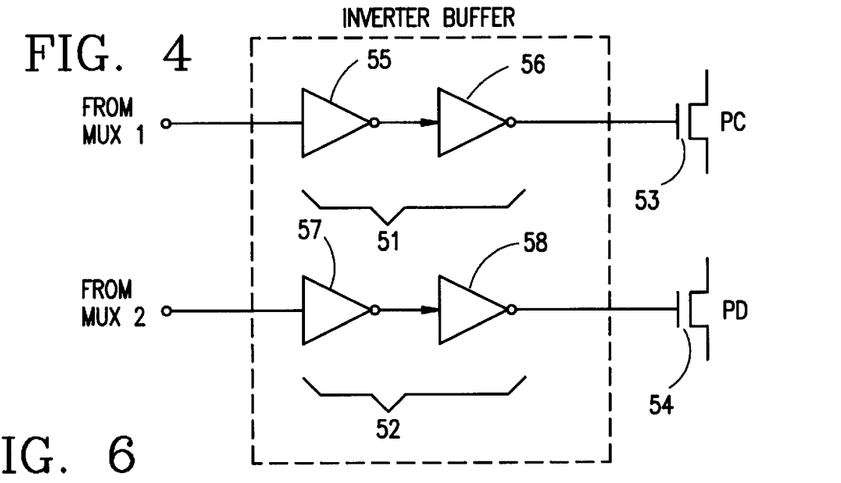
FIG. 4 shows an optional buffer circuit for the embodiment of FIG. 1.

FIG. 4 shows buffer 19A of FIG. 1 in greater detail.

If sufficient for the requirements of the data processing system, buffer 19A preferably includes two straight-through buffer amplification paths 51 and 52 to output transistors 53 and 54, respectively. Each path, as shown, includes two pairs of inverters 55 and 56 or 57 and 58, respectively connected in series. However, each path can include any even number of inverters, as deemed appropriate. Buffer amplifier 19A serves to eliminate signal noise spikes and protect inputs and can include circuitry for checking for errors or inconsistencies in the output signals to amplifiers 53 and 54.

Figure 5:
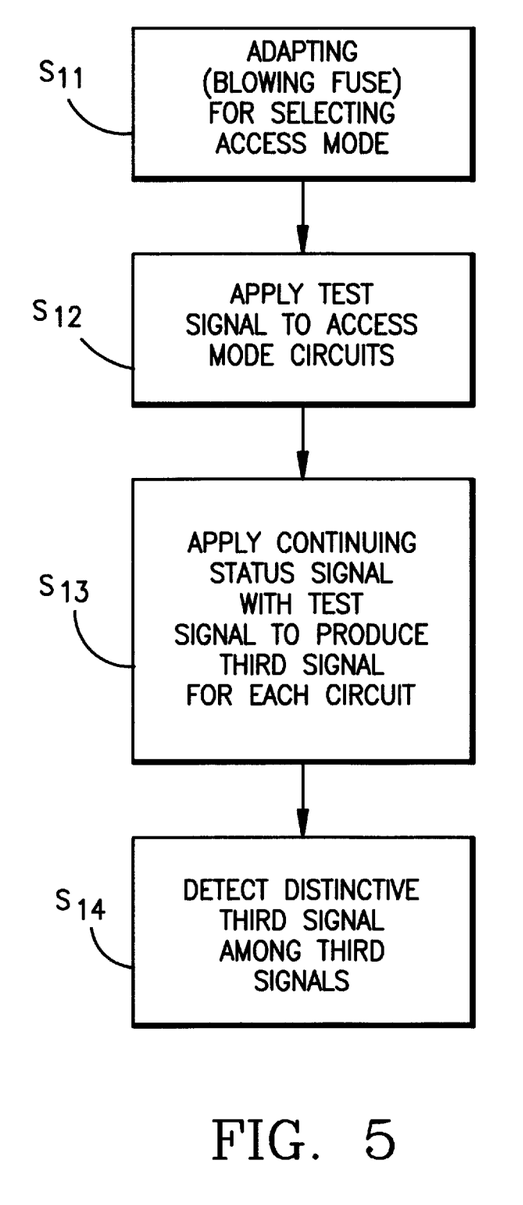
FIG. 5 shows a flowchart of a method according to the invention.

In the flow diagram of FIG. 5, an example of the method of the invention is illustrated.

In step S11, the memory is adapted to a selected access mode, for example the burst extended data-out mode for which the circuit is illustrated in FIG. 1. The adapting is accomplished by blowing fuse 14A.

In step S12, the test signal TM is applied to the center input point of the pair of multiplexers at each test circuit 12A, 12B, or 12C. Test signal TM is a step function of voltage that continues for a limited time. In FIG. 1, the test signal TM is applied to access test circuit 12A. And test signal TM is also applied to access test circuits 12B and 12C, which are essentially identical and are not shown in detail.

In step S13, the continuing status signal, e.g., from cell 15A, is applied in direct and inverted form to multiplexers 21A and 20A, respectively. Thus, the continuing status signal and its inverse are present at the outputs of the multiplexers during the limited time that test signal TM is also present. The continuing status signal, however, does not interfere with the transmission of the I/O signals through the access test circuit 12A to and from array 17 during the times that test signal TM is not present.

As shown in step S14, multiplexers 20A and 21A apply their respective output signals through buffer 19A and respective output transistors 22A and 23A to produce the ultimate output signal at DQ pad 13A. Similar events also occur in access test circuits 12B and 12C. Because of the blowing of fuse 14A only, the ultimate output signal will be high at pad 13A, but not at pads 13B and 13C.

Figure 6:
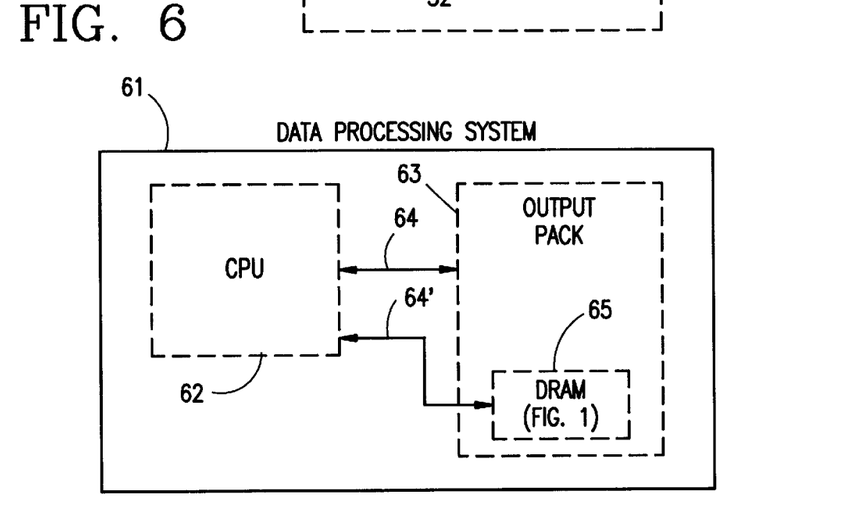
FIG. 6 illustrates a preferred data process system employing the DRAM of FIG. 1.

FIG. 6 illustrates the overall configuration of a data processing system 61 according to the invention. A central processing unit 62 is coupled with an output pack 63 of the data processing system 61 by the signal bus 64. DRAM 65, configured according to FIG. 1, is provided within the output pack 63, for convenience in the administration of the system.

It will be apparent to those skilled in the art that various modifications and variations can be made in the implementation of the present invention without departing from the spirit or scope of the invention. For example, the invention could be applied to other types of random access memories. Further, antifuses can be used instead of fuses, thereby permitting programming after the chip has been packaged. The present invention covers modifications and variations that come within the scope of the appended claims and their equivalents.

What is claimed is:

1. A memory comprising:
 a plurality of memory cells in an array having at least two coordinates;
 access circuitry connected to any of said plurality of memory cells according to a designated value of at least one of said at least two coordinates, said access circuitry including a plurality of selectable circuits respectively associated with a plurality of different access modes and selecting circuitry for selecting one of said selectable circuits to connect to any of said plurality of memory cells in an associated one of said plurality of different access modes; and
 test signal circuitry having an input terminal for a test signal for identifying in response to a test signal said selected one of said selectable circuits, said test signal circuitry including a plurality of connections each connection to a respective one of said plurality of selectable circuits, and output circuitry for indicating said selected one of said selectable circuits.

2. The memory according to claim 1, wherein:
 each of said plurality of selectable circuits includes a node operable between a first and second voltage values;

said selecting circuitry comprises a circuit driving said node from one to the other of said first and second voltage values; and each of said plurality of connections of said test signal circuitry connects to a respective one of said plurality of selectable circuits at a respective said node.

3. The memory according to claim 2, further including a plurality of multiplexers, and wherein:

said input terminal for a test signal is connected to said respective node through a respective one of said plurality of multiplexers.

4. The memory according to claim 3, wherein:

said output circuits comprises an output terminal and a buffer circuit for connecting said plurality of multiplexers to said output terminal.

5. The memory according to claim 4, wherein:

said output circuitry further comprises a plurality of inverter circuits, each responsive to a respective one of said multiplexers and connected to said output terminal.

6. The memory according to claim 1, wherein:

the plurality of selectable circuits include:
a first selectable circuit for a fast page access mode; and
a second selectable circuit for a mode different from said fast page access mode; and each of said plurality of selectable circuits includes a node operable between a first and second voltage values;

said selecting circuitry comprises a driving circuit that drives said node of said first circuit from one to the other of said first and second voltage values without driving said node of said second circuit between said first and second voltage values; and each of said plurality of connections of said test signal circuitry connects to said respective one of said plurality of selectable circuits at a respective said node.

7. The memory according to claim 1, wherein: the plurality of selectable circuits include:

a first selectable circuit for an extended data-out access mode; and
a second selectable circuit for a mode different from said extended data-out access mode; and each of said plurality of selectable circuits includes a node operable between a first and second voltage values;

said selecting circuitry comprises a circuit that drives said node of said first selectable circuit from one to the other of said first and second voltage values without driving said node of said second selectable circuit between said first and second voltage values; and each of said plurality of connections of said test signal circuitry connects to said respective one of said plurality of selectable circuits at a respective said node.

8. The memory according to claim 1, wherein: the plurality of selectable circuits include:

a first selectable circuit for a burst extended data-out access mode; and
a second selectable circuit for a mode different from said burst extended data-out access mode; and each of said plurality of selectable circuits includes a node operable between a first and second voltage values;

said selecting circuitry comprises a circuit that drives said node of said first circuit from one to the other of said first and second voltage values without driving said node of said second circuit between said first and second voltage values; and each of said plurality of connections of said test signal circuitry connects to said respective one of said plurality of selectable circuits at a respective said node.

9. A data processing system including input and output terminals and a processor connected between said input and output terminals, said processor comprising at least one central processing unit and a memory, said memory comprising:

a plurality of memory cells in an array having at least two coordinates;

access circuitry connecting to any of said plurality of memory cells according to a designated value of at least one of said at least two coordinates, said access circuitry including a plurality of selectable circuits respectively associated with a plurality of different access modes and selecting circuitry for selecting one of said selectable circuits to connect to any of said plurality of memory cells in an associated one of said plurality of different access modes; and test signal circuitry having an input terminal for a test signal for identifying in response to said test signal a selected one of said selectable circuits or said associated one of said plurality of different modes, said test signal circuitry including a plurality of connections, each to a respective one of said plurality of selectable circuits, and an output circuitry indicating said selected one of said selectable circuits.

10. The data processing system according to claim 9, wherein:

each of said plurality of selectable circuits includes a node operable between a first and second voltage values;

said selecting circuitry comprises a circuit that drives said node from one to the other of said first and second voltage values; and each of said plurality of connections of said test signal circuitry connects to said respective one of said plurality of selectable circuits at a respective said node.

11. The data processing system according to claim 10, further including a plurality of multiplexers, and wherein:

said input terminal for a test signal is connected to said respective node through a respective one of said plurality of multiplexers.

12. The data processing system according to claim 11, wherein:

said output circuitry comprises an output terminal and a buffer circuit for connecting said plurality of multiplexers to said output terminal.

13. The data processing system according to claim 12, wherein:

said output circuitry further comprises a plurality of logic circuits, each responsive to a respective one of said multiplexers and connected to said output terminal.

14. The data processing system according to claim 9, wherein:

the plurality of selectable circuits include:
a first circuit for a fast page access mode; and
a second circuit for a mode different from said fast page access mode; and each of said plurality of selectable circuits includes a node operable between a first and second voltage values;

said selecting circuit comprises a circuit that drives said node of said first circuit from one to the other of said first and second voltage values without driving said node of said second circuit between said first and second voltage values; and each of said plurality of connections of said test signal circuitry connects to said respective one of said plurality of selectable circuits at a respective said node.

15. The data processing system according to claim 9, wherein:
the plurality of selectable circuits include:
a first circuit for an extended data-out access mode; and
a second circuit for a mode different from said extended data-out access mode; and
each of said plurality of selectable circuits includes a node operable between a first and second voltage values;
said selecting circuit comprises a circuit that drives said node of said first circuit from one to the other of said first and second voltage values without driving said node of said second circuit between said first and second voltage values; and
each of said plurality of connections of said test signal circuitry connects to said respective one of said plurality of selectable circuits at a respective said node.

16. The data processing system according to claim 9, wherein:
the plurality of selectable circuits include:
a first circuit for a burst extended data-out access mode; and
a second circuit for a mode different from said burst extended data-out access mode; and
each of said plurality of selectable circuits includes a node operable between a first and second voltage values;
said selecting circuitry comprises a circuit that drives said node of said first circuit from one to the other of said first and second voltage values without driving said node of said second circuit between said first and second voltage values; and
each of said plurality of connections of said output circuitry connects to said respective one of said plurality of selectable circuits at a respective said node.

17. A method of identifying a memory comprising the steps of:
selecting one of a plurality of selectable access modes for said memory each associated with one of a plurality of access mode control circuits each coupled to a node, by establishing an activating signal at said coupled node;
applying a test signal to said memory via one of said plurality of access mode control circuits;
providing input/output signals with said activating signal to produce a third signal indicative of selection or nonselection of a respective access mode in response to said test signal; and
applying said third signal to a respective output terminal for each of said plurality of access mode circuits as a respective output signal, whereby said selected access mode is identified by one output signal that differs among the output signals of each of said plurality of access mode circuits.

18. The method according to claim 17, wherein:
the selecting step includes the step of selecting one among the plurality of differing access mode circuits that respectively provide different speeds of sending data from the memory.

19. The method according to claim 18, wherein:
the test signal applying step applies the test signal to a plurality of different sites in the memory, each of said sites being associated with a respective one of said plurality of differing access mode circuits.

20. The method according to claim 19, wherein:
the third signal applying step includes the step of buffering the multiplexed signals from the respective output terminal.

21. The method according to claim 20, wherein:
the test signal applying step includes the step of separately processing the result of multiplexing the multiplexed signals in each of said plurality of differing access mode circuits.

22. The method according to claim 21, wherein the processing step includes the step of providing the test signal, the third signal, and input/output data signals for the memory to respective first, second, and third input terminals of each of a first and second multiplexer circuits.

23. The method according to claim 22, including the step of providing a first circuit for a fast page access mode as said selected one of said plurality of differing access mode circuits.

24. The method according to claim 22, including the step of providing a first circuit for an extended data-out access mode as said selected one of said plurality of differing access mode circuits.

25. The method according to claim 22, including the step of providing a first circuit for a burst extended data-out access mode as said selected one of said plurality of differing access mode circuits.

26. The method according to claim 22, wherein the step of providing the input/output data signals includes the step of providing respective signals bearing data to be stored in, or data read out from, said memory.

27. The memory according to claim 1, wherein the selecting circuitry includes a blown fuse.

28. The data processing systems according to claim 9, wherein the selecting circuitry includes a blown fuse.

29. The method according to claim 17, wherein the selecting step includes the step of blowing a fuse.

* * * * *

UNITED STATES PATENT AND TRADEMARK OFFICE
CERTIFICATE OF CORRECTION

PATENT NO. : 5,812,470
DATED : 9/22/98
INVENTOR(S) : Roland Ochoa et al.

It is certified that error appears in the above-identified patent and that said Letters Patent is hereby corrected as shown below:

Column, line 6, "NUX2" should read --MUX2--; and
line 32, "of 22A" should read --of transistor 22A--.

Claim 4, line 13, "circuits" should read --circuitry--.

Signed and Sealed this

Sixteenth Day of February, 1999

Attest:

Attesting Officer

Acting Commissioner of Patents and Trademarks